US008462154B2

(12) United States Patent
Mawby et al.

(10) Patent No.: US 8,462,154 B2
(45) Date of Patent: Jun. 11, 2013

(54) SYSTEM AND METHOD FOR DETERMINING A VIRTUAL CURVE IN AN OBJECT MODEL

(75) Inventors: Eric Mawby, Windham, NH (US); Lingyun Lu, Diamond Bar, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 798 days.

(21) Appl. No.: 12/625,163

(22) Filed: Nov. 24, 2009

(65) Prior Publication Data

US 2010/0231587 A1 Sep. 16, 2010

Related U.S. Application Data

(60) Provisional application No. 61/159,582, filed on Mar. 12, 2009.

(51) Int. Cl.
*G06T 15/00* (2011.01)
(52) U.S. Cl.
USPC ........... 345/420; 345/419; 345/441; 345/629; 380/200
(58) Field of Classification Search
USPC ........... 345/419, 420, 441, 442, 629; 380/200
See application file for complete search history.

(56) References Cited

U.S. PATENT DOCUMENTS

| 5,345,546 | A | * | 9/1994 | Harada et al. ............ 345/442 |
| 5,615,317 | A | | 3/1997 | Freitag |
| 5,774,549 | A | * | 6/1998 | Nielsen ................ 380/200 |
| 6,181,978 | B1 | | 1/2001 | Hinds et al. |
| 6,683,620 | B1 | | 1/2004 | Burke |
| 2002/0180729 | A1 | | 12/2002 | Sohoni |
| 2004/0257362 | A1 | | 12/2004 | Sohoni |

OTHER PUBLICATIONS

Freitag et al, Enhancements in Blending Algorithms, Hewlett-Packard Journal, Oct. 1995, pp. 24-34.*
Kos et al, Methods to Recover, Constant Radius Rolling Ball Blends in Reverse Engineering, Computer and Automation Research Institute, Budapest, May 2002, pp. 1-30.*
Thakur, et al. Published by Computer-Aided Design, vol. 41, No. 2, Feb. 1, 2009 (pp. 65-80). Elsevier Publishers; Magazine.
Varady, et al. Published in Geometric Modeling and Processing 2000. Theory and Applications. Proceedings Hong Kong, IEEE Comput. Soc, Apr. 10, 2000 (pp. 3-12); Magazine.

* cited by examiner

*Primary Examiner* — Phu K Nguyen

(57) ABSTRACT

A method for a CAD system, a CAD system, and instructions for a CAD system. A method includes loading an object model, the object model including a blend face. The method also includes finding underfaces of the blend face and constructing an intersection curve according to the underfaces. The method also includes trimming the intersection curve according to the blend face to produce a virtual blend curve, and storing the virtual blend curve.

21 Claims, 3 Drawing Sheets

SYSTEM AND METHOD FOR DETERMINING A VIRTUAL CURVE IN AN OBJECT MODEL

CROSS-REFERENCE TO OTHER APPLICATION

This application claims priority from U.S. Provisional Patent Application 61/159,582, filed Mar. 12, 2009, which is hereby incorporated by reference.

TECHNICAL FIELD

The present disclosure is directed, in general, to computer-aided design, visualization, and manufacturing systems, and similar systems, referred to herein individually and collectively as "CAD systems."

BACKGROUND OF THE DISCLOSURE

Object models in CAD systems are typically represented using linear-history features or history-free features. It is often useful to know the dimensions of object models or certain components of an object model.

SUMMARY OF THE DISCLOSURE

Various embodiments include methods for CAD systems, CAD systems, and instructions for CAD systems.

In some embodiments, a method includes loading an object model, the object model including a blend face. This method also includes finding underfaces of the blend face and constructing an intersection curve according to the underfaces. This method also includes trimming the intersection curve according to the blend face to produce a virtual blend curve, and storing the virtual blend curve.

The foregoing has outlined rather broadly the aspects and technical advantages of the present disclosure so that those skilled in the art may better understand the detailed description that follows. Additional aspects and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
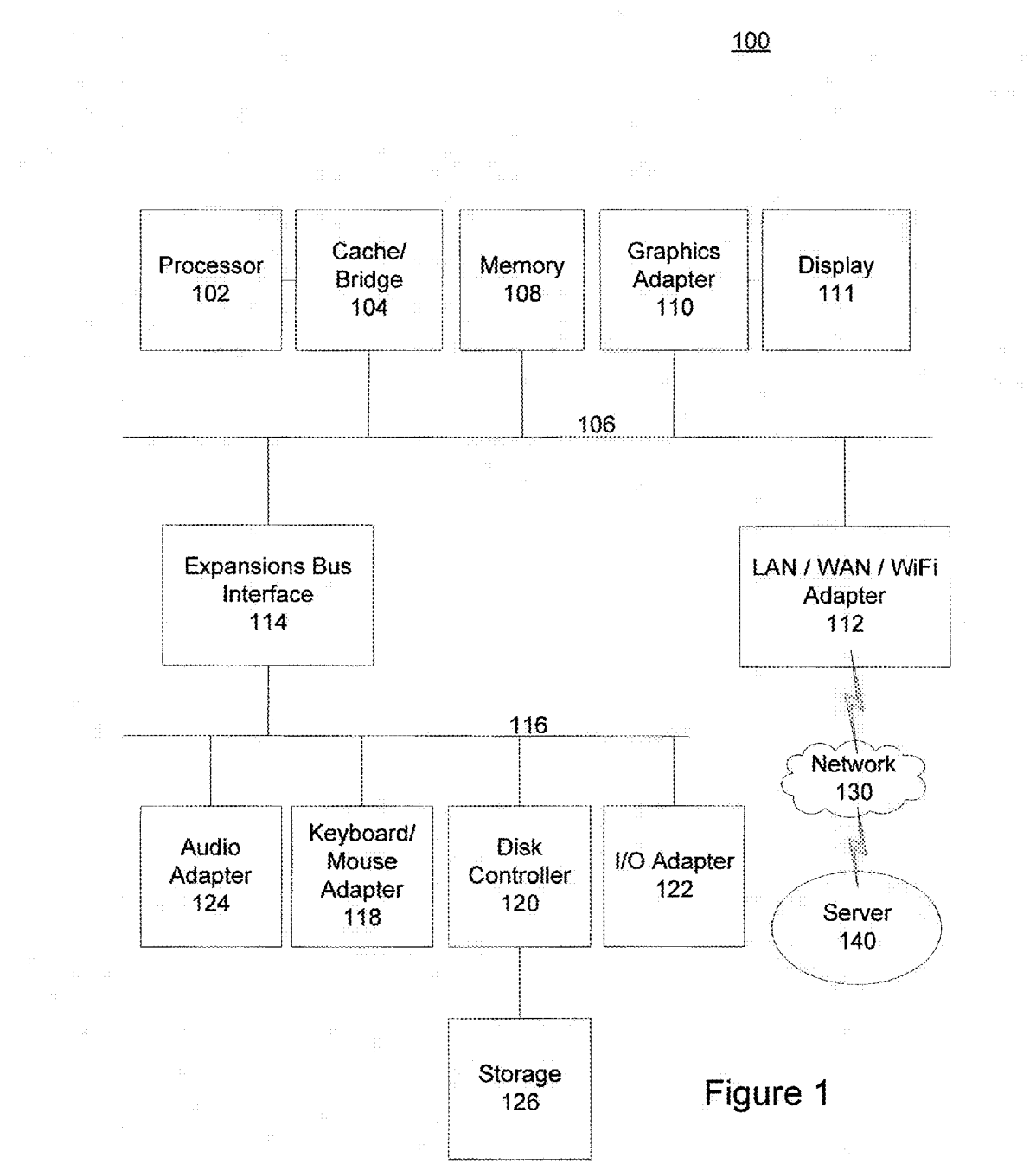
FIG. 1 depicts a block diagram of a data processing system in which an embodiment can be implemented.
Figure 2:
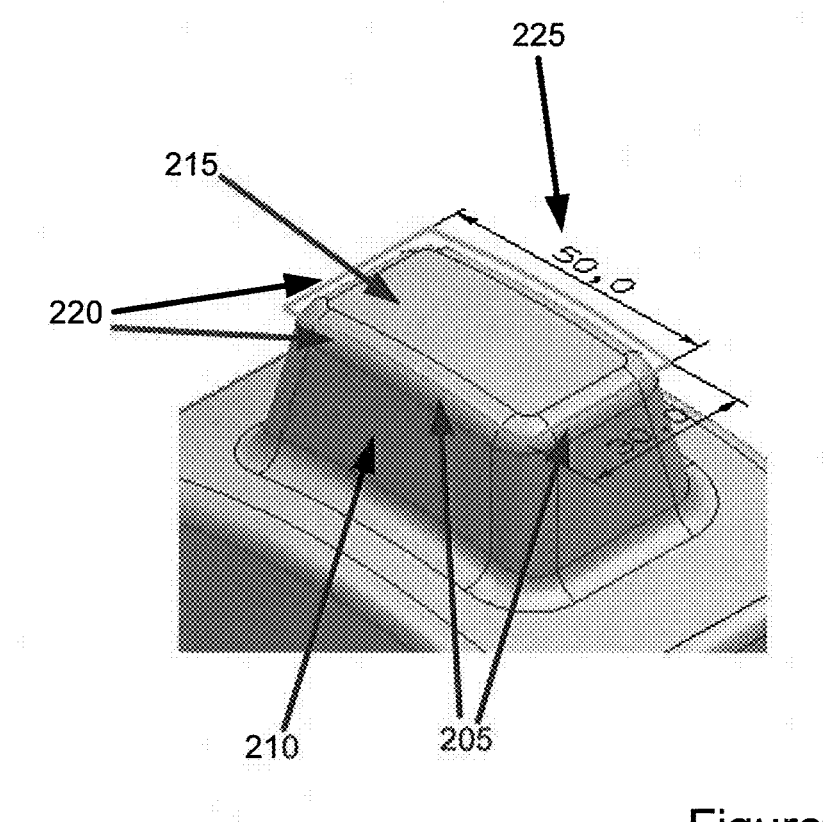
FIG. 2 illustrates dimensioning an aspect of a simple exemplary object model.
Figure 3:
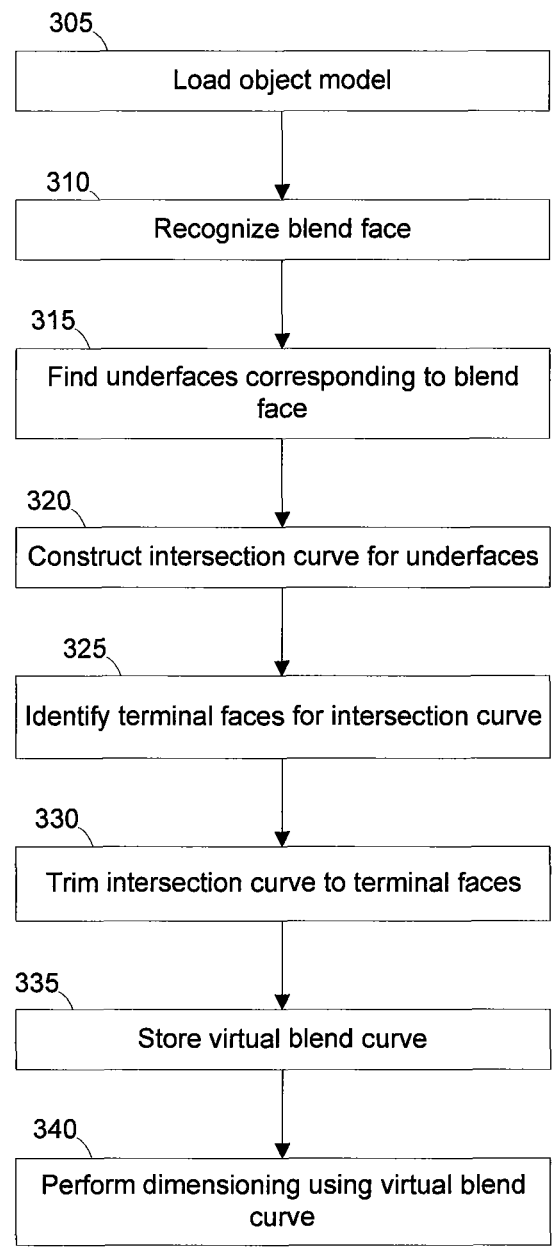
FIG. 3 depicts a high level process to construct a curve to replicate an edge that existed prior to an edge blend.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

In linear-history modeling, an object model in a CAD system is constructed with a practice conducive to dimensioning a nominal state of the model. Form features are constructed early in history, and typically include precise edges bounding each face. A pad or pocket is constructed from a profile with sharp corners at nominal dimensions. Detail features such as draft and blend are added later and modify the geometry of the model. Blends replace the nominal sharp edges. The nature of history maintains order so that nominal dimensions continue to drive the model prior to the blends, and can be referenced in later operations.

On the other hand, a history-free model, and imported model, or other object model may include only blend edges, without underlying definition of the original sharp edges. Since the blend edges are usually not useful or effective for dimensioning a face, it can be very difficult to dimension such a model. The disclosed embodiments include systems and methods for automatically creating a virtual blend curve that can act as a sharp edge for accurate dimensioning operations.

FIG. 1 depicts a block diagram of a data processing system in which an embodiment can be implemented, for example as a CAD system particularly configured by software or otherwise to perform the processes as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

FIG. 2 illustrates dimensioning an aspect of a simple exemplary object model. FIG. 2 shows a pad having blended edges 205 between the side faces 210 and the top face 215. To dimension the pad shown below the interesting and necessary character of the pad are the nominal sharp corners depicted by the curves 220, no longer present in the object model. Curves 220 can correspond to an original intersection between side faces 210 and the top face 215, and are useful for dimensioning the model object.

A dilemma for history-free modeling is that the current state of the model has blends, not nominal sharp edges. In history-free modeling there is no history tree to roll back to recover the nominal edges. Dimensioning the tangent edge of a blend face 205 is not meaningful, nor is dimensioning to edges of a blend itself. These edges are byproduct topology that result from adding the blend. They are not design objects that describe the form of the model.

The embodiments described herein allow the system to automatically generate the curves 220 that can be used for dimensioning various faces or aspects of an object model, to produce dimensions such as dimensions 225, that will be stored in the CAD system and optional displayed. These embodiments allow modifying the current state of a model without regard for how the model was constructed, by generating a facsimile of a pre-blend edge at the current state of the model in a synchronous manner.

The description below uses a number of terms that are not necessarily standardized in the art. While the usage of specific terms is described below, those of skill in the art will recognize that other terms or phrases can be used to describe similar concepts, without departing from the scope of this disclosure.

A virtual curve is a curve constructed at the intersection of two faces to represent an edge that would exist in absence of a blend between those faces, which in many cases is a pre-blend edge.

Various embodiments described herein make a distinction between an edge blend, a corner blend, and a character blend. The distinctions are meaningful in a model that is even mildly complex and the various blends can be processed differently in various embodiments.

An edge blend is a blend that rolls between two faces whose mutual intersection would compose an edge in absence of the blend, and is eligible for a virtual curve.

A corner blend is a blend at the intersection of multiple other blends. A corner blend is not eligible for a virtual curve, in some embodiments but can be used when determining terminal faces. Corners can be complex and the process for distinguishing a corner blend provides a useful advantage over known systems.

A character blend is a face that is recognized by the CAD system as a blend but does not match the first glance mental description of a blend. Users tend to view blends as small detail features, but a character blend can be "large," comparatively speaking. Character blend contrasts with detail blend in that the character blend contributes to the form of the model. Edge and corner blends are details. Properly identifying a character blend is then important in distinguishing character from detail. The process for distinguishing a character blend provides a useful advantage over known systems.

The process described below for identifying terminal faces logic is used for producing a curve of appropriate length. The terminal face exists at the end of the would-be edge that the virtual curve represents. The terminal face logic is comprehensive in support of a wide variety of cases. In design of the logic attention is paid complex corners composed of multiple blend faces and vertices with neutral edges.

Various embodiments described herein can support creation and use of virtual blend curves for a number of surface types. Various embodiments support analytic blend faces including cylinder, sphere, and torus. Various embodiments also support non-analytic blend faces such as a BSurface.

Some embodiments also process a surface type named "rolling ball blend" surface, which is a rolling ball BSurface (also known as B-spline surface or NURB surface). A rolling ball blend is a constant-radius blend whose form is conceptualized as a ball (sphere, marble) rolling between two faces, maintaining constant contact with the faces. If a model is completely orthogonal and composed of planes and cylinders then blends are likely analytic surface types. If the model is even mildly complex with tapered or curved face which are not simply orthogonal then blends between those faces are not analytic surfaces, they are "blend" surfaces. The blend surface type is prevalent in many commercial models.

A blend chain is a set of connected blends that share the same radius and convexity.

An underface, as used herein, is a face that underlies a blend—one of the faces that the blend rolls between. A neighbor face is a face that is adjacent to, sharing and edge with, a given face. A terminal face is a face that defines the extent of a virtual curve.

The embodiments disclosed herein allow synchronous modeling that performs in a source-independent manner, working equally well on models both foreign and domestic, and are particularly well suited for imported parts. Imported parts have no history and the processes described herein do not rely on an object model history.

Various embodiments include a CAD system, a method performed by a CAD system, and a related computer program product that construct a curve for an object model to replicate a sharp edge that existed prior to blending. Significant use of this curve is to dimension the model, but such uses are not limited to dimensioning. Some embodiments include determining points anywhere along the virtual curve for any use where snap point is meaningful.

FIG. 3 depicts a high level process to construct a curve to replicate an edge that existed prior to an edge blend. Various broad steps described here are described in more detail below, as are additional or sub-steps related to these process steps.

The CAD system first loads an object model including at least one blend face (step 305). "Loading" in this context can include retrieving from a storage, receiving from another system such as over a network, receiving an object model definition through an interaction with a user, and otherwise as recognized by those of skill in the art.

The CAD system recognizes at least one face of the object model as a blend face (step 310). As part of this step, the CAD system can distinguish an edge blend from a corner blend from a character blend. In some embodiments, the CAD system can receive a user input indicating the blend face to be processed.

The CAD system finds the "underfaces" of the object model that underlie the blend face (step 315). These are typically the faces that the blend rolls between.

The CAD system constructs an intersection curve between the underfaces of the blend face (step 320). This intersection curve is the intersection of the underfaces, and is a "raw", untrimmed virtual curve.

The CAD system finds the terminal face or faces of the object model that define the length of the intersection curve (step 325). The CAD system may restrict this operation to the area or neighborhood of the target blend, and may also identify corner blends and neutral edges as part of this step.

The CAD system trims the intersection curve to the terminal faces (step 330). This involves finding an intersection point between the raw virtual blend curve and the surface of the terminal face(s), and extending or trimming (shortening) the curve to that intersection point.

In some cases, multiple intersection points will be found between the virtual curve and the terminal faces. The region of the virtual curve to keep is the region within the range of the blend face.

In some cases, the raw virtual curve can only trim based on a single terminal face. In this case, the same terminal face can be used for both ends. Two intersection points on the same surface are used, and the area of the virtual curve to keep is in the area of the blend.

In some special cases, a terminal face cannot be found or is unusable for trimming the curve. In these less ideal cases, the CAD system trims the curve to the length of the blend.

After trimming the intersection curve, the CAD system stores the trimmed intersection curve as a virtual blend curve and optionally displays it (step 335).

The system can perform other steps in addition to or subsequent to constructing the virtual blend curve. In some cases, the system can migrate the model from curve to edge using the virtual blend curve (blended to sharp) in the event a blend is deleted subsequently. Similarly, the system can introduce a curve and migrate from edge to curve (sharp to blended) in the event that a blend is added subsequently.

Once the virtual blend curve is constructed, in some embodiments, the curve itself can exhibit "evergreen" behavior by being automatically updated by the CAD system. The system can automatically adapt the curve in the event of model change, and re-execute the processes described herein to re-construct the curve in the event that the blend undergoes topology change.

Once constructed, the virtual blend curve can be used for determining, maintaining, and storing dimensions as described herein (step 340), either against another feature of the model, or against another virtual blend curve (as illustrated in FIG. 2). The curve can participate in the constraint structure of a synchronous dimension for purpose of driving model geometry.

In some cases, the processes described herein for constructing the virtual blend curve are performed in response to a user interaction. For example, in some cases, construction of the curve occurs interactively within a client command, such as a synchronous dimension command. In other cases, it can be performed automatically without a specific command. For example, a user selection such as a "mouse hover" over a blend face or other portion of an object model can cause the system to automatically construct virtual blend curves for one or more blended faces (if the model does not already include this data), and automatically determine and store the relevant dimensions.

The CAD system can apply a set of rules to determine if a selected blend is a corner blend. In some embodiments, these rules include a set of conditions that indicate whether the blend is a candidate corner blend, and a set of disqualifiers that disqualifies a candidate corner blend from being designated as a corner bend. A blend that corresponds to the rules—meets one or more of the conditions but does not match a disqualifier—is a corner blend.

Conditions (a blend must satisfy one or more condition to be a corner blend):
a) Spherical blend at the intersection of three blends of equal radius.
b) 3-sided blend with all edges connected to other blends. This is a generalization of condition (a), and is a special case of and supersedes condition (c).
c) 3 or more edges connected to other blends.
d) Edge-connected to a blend of the same radius, and so is a blend chain member.
e) 1 underface is a blend.
f) 2 underfaces are blends.

Disqualifiers (disqualifies the blend as a corner blend):
D1) Blend is a cylinder. (A cylinder can be an edge blend or character blend but not a corner blend.)
D2) An underface is a character blend.

The process of finding the terminal faces of the object model in step 325 can include a subprocess. In various embodiments, the terminal face is known to be in the neighborhood of the input blend. For example, the neighborhood can include a corner blend at the end of an edge blend and the neighbors of the corner blend. An underface of the input blend cannot be a terminal face. A corner blend cannot be a terminal face. A blend face that is the under of a corner blend cannot be a terminal face.

To find terminal faces, the CAD system first loads the object model including the blend face. Of course, in the context of the process of FIG. 3, the object model may already be loaded and the blend face identified. The CAD system finds the neighboring faces of the blend face (step 410).

The CAD system excludes neighboring faces that are underfaces of the blend face. Then, the CAD system discriminates the remaining neighboring faces in a three-stage process.

In the first stage, if the neighbor is not a blend it is a terminal face. Otherwise, if the neighboring face is a character blend then it is a terminal face. If the neighbor is a corner blend, the CAD system will find its underfaces, exclude any underfaces that are also underfaces of the input blend face, and continue to the second stage.

In the second stage, the CAD system processes any underfaces remaining from the first stage. Of the remaining faces, if the underface is not a blend then it is a terminal face, otherwise if the neighbor is a character blend then it is a terminal face. Otherwise, if the under is a corner blend or an edge blend, the CAD system will find its underfaces, exclude any underfaces that are also underfaces of the input blend face, and continue to the third stage.

In the third stage, the CAD system processes any underfaces remaining from the second stage. If the under is not a blend, then it is a terminal face. If the neighbor is a character blend, then it is a terminal face.

In most cases, three stages should find the terminal faces. For a blend with a neighbor that is a corner blend of a 3-edge vertex this is all that is needed to find a terminal face. Additional processing stages like those above may be required for a corner with more than 3 blends entering the vertex.

Of course, those of skill in the art will recognize that, unless specifically indicated or required by the sequence of operations, certain steps in the processes described above may be omitted, performed concurrently, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for use in a CAD system, comprising:
   loading an object model in a CAD system, the object model including a blend face;
   finding underfaces of the blend face by the CAD system;
   constructing an intersection curve, by the CAD system, according to the underfaces;
   trimming the intersection curve according to the blend face, by the CAD system, to produce a virtual blend curve; and
   storing the virtual blend curve in the CAD system.

2. The method of claim 1, wherein trimming the intersection curve is one of shortening the intersection curve to an appropriate length and extending the intersection curve to an appropriate length.

3. The method of claim 1, wherein the finding, constructing, trimming, and storing are performed automatically in response to a user selection of the blend face.

4. The method of claim 1, further comprising performing a dimensioning process by the CAD system using the virtual blend curve.

5. The method of claim 1, further comprising recognizing, by the CAD system at least one face of the object model as the blend face.

6. The method of claim 1, further comprising finding at least one terminal face corresponding to the blend face, wherein the trimming is performed according to the surface of the at least one terminal face.

7. The method of claim 1, further comprising applying a set of rules by the CAD system to determine if the blend face is a corner blend.

8. A CAD system, comprising a processor and accessible memory, the CAD system particularly configured to perform the steps of:
   loading an object model, the object model including a blend face;
   finding underfaces of the blend face;
   constructing an intersection curve according to the underfaces;
   trimming the intersection curve according to the blend face to produce a virtual blend curve; and
   storing the virtual blend curve.

9. The CAD system of claim 8, wherein trimming the intersection curve is one of shortening the intersection curve to an appropriate length and extending the intersection curve to an appropriate length.

10. The CAD system of claim 8, wherein the finding, constructing, trimming, and storing are performed automatically in response to a user selection of the blend face.

11. The CAD system of claim 8, wherein the CAD system is further configured to perform a dimensioning process by the CAD system using the virtual blend curve.

12. The CAD system of claim 8, wherein the CAD system is further configured to recognize at least one face of the object model as the blend face.

13. The CAD system of claim 8, wherein the CAD system is further configured to find at least one terminal face corresponding to the blend face, wherein the trimming is performed according to the surface of the at least one terminal face.

14. The CAD system of claim 8, wherein the CAD system is further configured to apply a set of rules by the CAD system to determine if the blend face is a corner blend.

15. A tangible non-transitory computer-readable medium encoded with computer-executable instructions that, when executed, cause a CAD system to perform the steps of:
    loading an object model, the object model including a blend face;
    finding underfaces of the blend face;
    constructing an intersection curve according to the underfaces;
    trimming the intersection curve according to the blend face to produce a virtual blend curve; and
    storing the virtual blend curve.

16. The computer-readable medium of claim 15, wherein trimming the intersection curve is one of shortening the intersection curve to an appropriate length and extending the intersection curve to an appropriate length.

17. The computer-readable medium of claim 15, wherein the finding, constructing, trimming, and storing are performed automatically in response to a user selection of the blend face.

18. The computer-readable medium of claim 15, further encoded with instructions causing the CAD system to perform a dimensioning process by the CAD system using the virtual blend curve.

19. The computer-readable medium of claim 15, further encoded with instructions causing the CAD system to recognize at least one face of the object model as the blend face.

20. The computer-readable medium of claim 15, further encoded with instructions causing the CAD system to find at least one terminal face corresponding to the blend face, wherein the trimming is performed according to the surface of the at least one terminal face.

21. The computer-readable medium of claim 15, further encoded with instructions causing the CAD system to apply a set of rules by the CAD system to determine if the blend face is a corner blend.

* * * * *